United States Patent
Nezuka

(10) Patent No.: US 8,552,895 B2
(45) Date of Patent: Oct. 8, 2013

(54) SIGMA-DELTA MODULATOR FOR REDUCING POWER CONSUMPTION AND SUITABLE FOR HIGH-SPEED OPERATIONS

(75) Inventor: Tomohiro Nezuka, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 0 days.

(21) Appl. No.: 13/519,501

(22) PCT Filed: Dec. 22, 2010

(86) PCT No.: PCT/JP2010/073161
§ 371 (c)(1),
(2), (4) Date: Sep. 10, 2012

(87) PCT Pub. No.: WO2011/081069
PCT Pub. Date: Jul. 7, 2011

(65) Prior Publication Data
US 2012/0326905 A1      Dec. 27, 2012

(30) Foreign Application Priority Data
Dec. 29, 2009   (JP) .................................. 2009-299253

(51) Int. Cl.
*H03M 3/00*      (2006.01)
(52) U.S. Cl.
USPC ............ 341/143; 341/144; 341/155; 341/136
(58) Field of Classification Search
USPC ............................................... 341/130–155
See application file for complete search history.

(56) References Cited

U.S. PATENT DOCUMENTS

| | | | | |
|---|---|---|---|---|
| 5,298,900 A | * | 3/1994 | Mauthe et al. | 341/143 |
| 5,648,779 A | * | 7/1997 | Cabler | 341/143 |
| 6,313,775 B1 | * | 11/2001 | Lindfors et al. | 341/143 |
| 6,768,435 B2 | * | 7/2004 | Xu | 341/143 |
| 6,954,161 B2 | * | 10/2005 | Inukai et al. | 341/143 |
| 7,109,903 B2 | * | 9/2006 | Suzuki | 341/144 |
| 7,248,192 B2 | * | 7/2007 | Gillespie et al. | 341/118 |
| 7,439,893 B2 | * | 10/2008 | Inukai et al. | 341/143 |
| 7,545,301 B2 | * | 6/2009 | Kim et al. | 341/143 |
| 7,567,192 B2 | * | 7/2009 | Colmer | 341/143 |
| 7,636,056 B2 | * | 12/2009 | Inukai et al. | 341/143 |
| 7,939,293 B2 | * | 5/2011 | Habermann et al. | 435/68.1 |

FOREIGN PATENT DOCUMENTS

| | | | |
|---|---|---|---|
| JP | 04-243326 A | 8/1992 | |
| JP | 08-307275 A | 11/1996 | |
| JP | 10-511233 A | 10/1998 | |
| JP | 2006-333053 A | 12/2006 | |
| JP | 2007-329840 A | 12/2007 | |

* cited by examiner

*Primary Examiner* — Lam T Mai
(74) *Attorney, Agent, or Firm* — Konomi Takeshita

(57) ABSTRACT

Disclosed herein is a sigma-delta modulator, including an integration circuit, a first DAC unit, and a second DAC unit. The integration circuit includes first and second terminals, and integrates a voltage supplied via the first terminal. The first DAC unit alternately supplies a first voltage obtained at one end of a first resistor to the first terminal and the second terminal. The second DAC unit alternately supplies a second voltage at the other end of a second resistor to the second terminal or the first terminal. The second DAC unit supplies the second voltage to the second terminal when the first DAC unit supplies the first voltage to the first terminal. The second DAC unit supplies the second voltage to the first terminal when the first DAC unit supplies the first voltage to the second terminal.

6 Claims, 6 Drawing Sheets

SIGMA-DELTA MODULATOR FOR REDUCING POWER CONSUMPTION AND SUITABLE FOR HIGH-SPEED OPERATIONS

FIELD OF THE INVENTION

The present invention relates to a sigma-delta modulator. In particular, the sigma-delta modulator according to the present invention can be suitably used for, for example, an analog-to-digital (A/D) converter that converts analog signals into digital signals. Furthermore, the present invention also relates to a digital-to-analog (D/A) converter that is used in the sigma-delta modulator.

BACKGROUND OF THE INVENTION

A/D converters have the function of converting analog data output by a sensor or the like into digital data. For this reason, such an A/D converter functions as an interface between a physical phenomenon and a digital circuit. A/D converters are widely used in a variety of fields such as the communication, medical and measurement fields, and are applied to radio devices such as mobile phones and television sets, medical instruments, health instruments, and measuring instruments.

The use of a sigma-delta modulator as a component of an A/D converter is known from, for example, Japanese Unexamined Patent Publication No. 2006-333053. The A/D converter using the sigma-delta modulator is characterized by suppressing quantization error in such a way as to integrate the differentials between input signals and a quantization step using an integration circuit and continuously quantize them. Using such a sigma-delta modulator, a relatively high-resolution A/D converter can be implemented using a relatively small-chip area semiconductor integrated circuit.

FIG. 5 is a circuit diagram of one configuration of an A/D converter using a conventional sigma-delta modulator. The A/D converter shown in FIG. 5 includes a sigma-delta modulator 5 and a filter 9.

The sigma-delta modulator 5 integrates reference voltages +Vref and −Vref, whose polarities are controlled using a digital signal Ψ, and input voltages +Vin and −Vin, quantizes them, and then outputs a binary (or multinary) digital signal Ψ.

The filter 9 is a decimation filter or the like. The filter 9 performs processing, such as filtering or integrating, averaging and the like, on the digital signal Ψ output by the sigma-delta modulator 5, and outputs digital data corresponding to the input voltages +Vin and −Vin. The timing of switching between the reference voltages +Vref and −Vref is determined by the digital signal Ψ, as will be described later.

The sigma-delta modulator 5 includes an integration circuit 10, a first DAC unit 34, a second DAC unit 54, and a comparator 70.

The integration circuit 10 includes a fully differential amplifier 101, a first capacitor 107, a second capacitor 109, a first input resistor 103, and a second input resistor 105.

The fully differential amplifier 101 includes a non-inverted input terminal and an inverted input terminal as input terminals, and includes an inverted output terminal and a non-inverted output terminal as output terminals. Furthermore, the voltages at the inverted output terminal and non-inverted output terminal of the fully differential amplifier 101 are output to the comparator 70 as the results of the integration.

The first capacitor 107 connects the inverted output terminal and non-inverted input terminal of the fully differential amplifier 101 to each other, and feeds back the signal of the inverted output terminal to the non-inverted input terminal. Furthermore, the second capacitor 109 connects the non-inverted output terminal and inverted input terminal of the fully differential amplifier 101 to each other, and feeds back the signal of the non-inverted output terminal to the inverted input terminal.

The comparator 70 makes reference to a sampling clock not shown in the drawing, compares the two results of the integration output from the fully differential amplifier 101 in synchronization with the transmission timing of the sampling clock, and outputs the results of the comparison as a binary digital signal Ψ.

The first input resistor 103 includes one end configured such that the input voltage +Vin is supplied thereto and the other end connected to the non-inverted input terminal of the fully differential amplifier 101. Furthermore, the second input resistor 105 includes one end configured such that the input voltage −Vin is supplied thereto and the other end connected to the inverted input terminal of the fully differential amplifier 101.

The first DAC unit 34 includes a first switch 343, a second switch 345, and a first resistor 341. The reference voltage +Vref is supplied to one end of the first switch 343, and the other end of the first switch 343 is connected to one end of the first resistor 341. Furthermore, the reference voltage −Vref is supplied to one end of the second switch 345, and the other end of the second switch 345 is connected to one end of the first resistor 341. The first switch 343 switches between an ON state and an OFF state in response to the digital signal Ψ. Furthermore, the second switch 345 switches between an ON state and an OFF state in response to the inverted signal of the digital signal Ψ. The first switch 343 and the second switch 345 operate in a complementary manner thanks to the digital signal Ψ, and therefore the reference voltages +Vref and −Vref are fed back to the integration circuit 10 in response to the digital signal Ψ.

The second DAC unit 54 includes a third switch 543, a fourth switch 545, and a second resistor 541. The reference voltage −Vref is supplied to one end of the third switch 543, and the other end of the third switch 543 is connected to one end of the second resistor 541. Furthermore, the reference voltage +Vref is supplied to one end of the fourth switch 545, and the to other end of the fourth switch 545 is connected to one end of the second resistor 541. The third switch 543 switches between an ON state and an OFF state in response to the digital signal Ψ. Furthermore, the fourth switch 545 switches between an ON state and an OFF state in response to the inverted signal of the digital signal Ψ. The third switch 543 and the fourth switch 545 operate in a complementary manner thanks to the digital signal Ψ, and therefore the reference voltages +Vref and −Vref are fed back to the integration circuit 10 in response to the digital signal Ψ.

SUMMARY OF THE INVENTION

In the A/D converter shown in FIG. 5, the voltage at one end of the first resistor 341 and the voltage at one end of the second resistor 541 vary between +Vref and −Vref in response to the digital signal Ψ.

However, resistor devices that constitute the first resistor 341 and the second resistor 541 have parasitic capacitance. For example, as indicated by dotted lines in FIG. 6, there are a parasitic capacitor 349 for producing parasitic capacitance between the first resistor 341 and the ground electric potential and a parasitic capacitor 549 for producing parasitic capacitance between the second resistor 541 and the ground electric potential.

When the voltage at one end of the first resistor 341 varies between +Vref and −Vref because of the parasitic capacitor 349, the parasitic capacitor 349 is charged with excessive charge or excessive charge is discharged from the parasitic capacitor 349. For this reason, when the response speed of the power circuit that supplies −Vref is insufficient, the reference voltage varies and therefore an error occurs in the output of the integration circuit. The same also occurs when the electric potential at one end of the first resistor 341 varies between −Vref and +Vref. Furthermore, the second resistor 541 is subjected to the same phenomenon because of the parasitic capacitor 549.

In order to overcome this problem, there may be contemplated a solution that increases the response speed of the power circuit to a considerably high speed. However, this solution increases the size of the circuit and also the power consumption of the power circuit. Furthermore, the time that is required until the electric potential of the resistor stabilizes is limited by the resistance values of the parasitic capacitor and the resistor itself, so that high-speed operation is impossible.

As a solution that does not increase the power consumption of the power circuit or the size of the circuit, there may be contemplated a method of arranging outside the integrated circuit high-capacity capacitors that are connected to the reference voltages +Vref and −Vref, respectively. However, this solution requires high-capacity capacitors, so that the manufacturing cost increases when they are mounted inside the integrated circuit and implemented on the same integrated circuit, and so that the manufacturing cost also increases because of the need for externally mounted capacitors and external pins for connecting the capacitors when they are mounted outside the integrated circuit. Furthermore, since connections to the reference voltages +Vref and −Vref are made by external pins, the influence of a parasitic component (parasitic inductance and/or parasitic resistance) cannot be avoided, so that high-speed operation encounters a limit and therefore there are cases where high-speed operation cannot be realized.

Furthermore, in the A/D converter shown in FIG. 5, the precision with which the resistance value of the first resistor 341 and the resistance value of the second resistor 541 are matched to each other influences the performance of the A/D converter. In order to increase the precision with which the resistance value of the first resistor 341 and the resistance value of the second resistor 541 are matched to each other, it is necessary to increase the areas of the resistor devices. When the areas of the resistor devices are increased, the parasitic capacitances of the resistor devices are also increased. For this reason, for example, when the electric potential at one end of the first resistor 341 varies between +Vref and −Vref, charging and discharging increase between the parasitic capacitor of the first resistor 341 and the power circuit supplying −Vref. For this reason, it is necessary to increase the transitional current supply capability of the power circuit, and power consumption or the size of the circuit is increased.

In accordance with one aspect of the present invention, there is provided a sigma-delta modulator, comprising an integration circuit configured to include a first terminal and a second terminal, and to integrate a voltage supplied via the first terminal; a first DAC unit configured to, when a first reference voltage is supplied to one end of a first resistor, alternately supply a first voltage obtained at the other end of the first resistor to the first terminal and the second terminal; and a second DAC unit configured to, when a second reference voltage is supplied to one end of a second resistor, alternately supply a second voltage obtained at the other end of the second resistor to the second terminal or the first terminal; wherein the second DAC unit supplies the second voltage to the second terminal when the first DAC unit supplies the first voltage to the first terminal, and the second DAC unit supplies the second voltage to the first terminal when the first DAC unit supplies the first voltage to the second terminal.

In accordance with one aspect of the present invention, there is provided A sigma-delta modulation circuit, comprising an integration circuit configured to include a first terminal and a second terminal, and to integrate voltages respectively supplied via the first terminal and the second terminal; a first DAC unit configured to alternately supply a first voltage, obtained at one end of a first resistor when a first reference voltage is supplied to the other end of the first resistor, and a second voltage, obtained at the other end of a second resistor when a second reference voltage is supplied to the other end of the second resistor, to the first terminal; a second DAC unit configured to alternately supply a third voltage, obtained at one end of a third resistor when the second reference voltage is supplied to the other end of the third resistor, and a fourth voltage, obtained at the other end of a fourth resistor when the first reference voltage is supplied to the other end of the fourth resistor, to the second terminal; a first switch configured to connect the one end of the second resistor to the one end of the fourth resistor, and to selectively enter an ON state and an OFF state; and a second switch configured to connect the one end of the first resistor to the one end of the third resistor, and to selectively enter an ON state and an OFF state; wherein when the first DAC unit supplies the first voltage to the first terminal, the second DAC unit supplies the third voltage to the second terminal, the first switch enters an ON state, and the second switch enters an OFF state; and wherein when the first DAC unit supplies the second voltage to the first terminal, the second DAC unit supplies the fourth voltage to the second terminal, the first switch enters an OFF state, and the second switch enters an ON state.

BRIEF DESCRIPTION OF THE DRAWINGS

The above and other objects, features and advantages of the present invention will be more clearly understood from the following detailed description taken in conjunction with the accompanying drawings, which illustrate, by way of example, the principles of the invention.

DETAILED DESCRIPTION OF THE INVENTION

Figure 1:
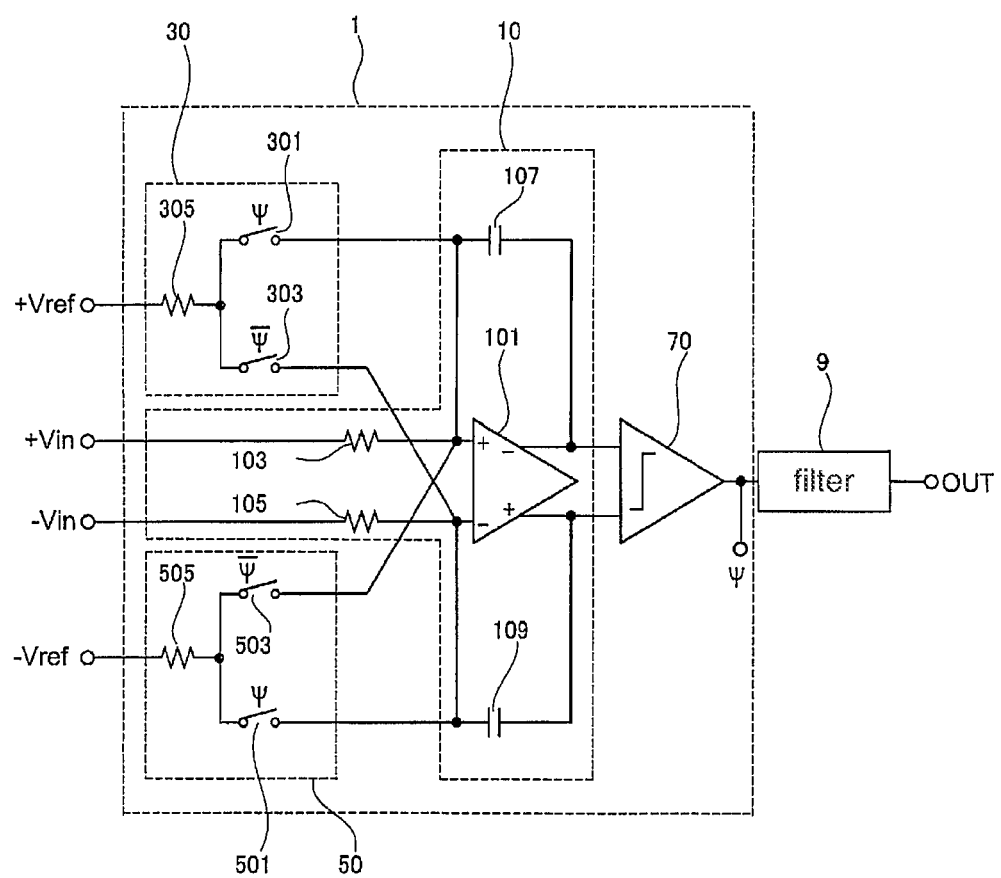
FIG. 1 is a circuit diagram of an A/D converter that is configured using a sigma-delta modulator according to a first embodiment of the present invention.

Embodiments of the present invention will be described in detail below with reference to the accompanying drawings. The present invention is not limited to the following embodiments, but may be subjected to a variety of variations and modifications. For example, the present invention may be applied to a high-order sigma-delta modulator. Throughout the drawings, the same reference characters are assigned to components having the same or like functions or characteristics. However, although different reference characters are assigned to components, the functions or characteristics of the components are not necessarily different.

Embodiment 1

FIG. 1 is a circuit diagram of an A/D converter that is configured using a sigma-delta modulator according to a first embodiment of the present invention. The MD converter shown in FIG. 1 includes a sigma-delta modulator 1 and a filter 9.

The sigma-delta modulator 1 integrates a first reference voltage +Vref and a second reference voltage −Vref, whose polarities are controlled using a digital signal Ψ, and input voltages +Vin and −Vin, quantizes them, and then outputs a binary (or multinary) digital signal Ψ. The sigma-delta modulator 1 includes an integration circuit 10, a comparator 70, a first DAC unit 30, and a second DAC unit 50.

The integration circuit 10 includes a fully differential amplifier 101, a first capacitor 107, a second capacitor 109, a first input resistor 103, and a second input resistor 105.

The fully differential amplifier 101 includes a non-inverted input terminal and an inverted input terminal as input terminals, and an inverted output terminal and a non-inverted output terminal as output terminals.

The first capacitor 107 is connected to the inverted output terminal and non-inverted input terminal of the fully differential amplifier 101, and feeds back a signal output by the inverted output terminal to the non-inverted input terminal. The second capacitor 109 is connected to the non-inverted output terminal and inverted input terminal of the fully differential amplifier 101, and feeds back a signal output by the non-inverted output terminal to the inverted input terminal.

One end of the first input resistor 103 and one end of the second input resistor 105 form two input terminals of the integration circuit 10. Furthermore, the voltages of the signals output via the inverted output terminal and non-inverted output terminal of the fully differential amplifier 101 are output to the comparator 70 as the results of the integration.

Input voltage +Vin is supplied to one end of the first input resistor 103, and the other end of the first input resistor 103 is connected to the non-inverted input terminal of the fully differential amplifier 101. Furthermore, input voltage −Vin is supplied to one end of the second input resistor 105, and the other end of the second input resistor 105 is connected to the inverted input terminal of the fully differential amplifier 101. Furthermore, it is preferred that the resistance value of the first input resistor 103 be equal to the resistance value of the second input resistor 105.

When the first reference voltage is supplied to one end of the first resistor 305, the first DAC unit 30 alternately supplies voltage (first voltage) obtained at the other end of the first resistor 305 to two input terminals of the fully differential amplifier 101 included in the integration circuit 10. In other words, the first reference is supplied to the one end of the voltage first resistor 305. Furthermore, the other end of the first resistor 305 is alternately connected to the two input terminals of the fully differential amplifier 101 included in the integration circuit 10. For example, when the digital signal Ψ is "H," the first DAC unit 30 supplies voltage obtained at the other end of the first resistor 305 to one input terminal of the fully differential amplifier 101 included in the integration circuit 10, but does not supply it to the other input terminal thereof. Furthermore, when the digital signal Ψ is "L," the first DAC unit 30 supplies voltage obtained at the other end of the first resistor 305 to the other input terminal of the fully differential amplifier 101 included in the integration circuit 10, but does not supply it to the one input terminal.

Furthermore, when the first reference voltage is supplied to one end of the first resistor 305, a voltage (first voltage) obtained at the other end of the first resistor 305 is approximately equal to the intermediate voltage between the first reference voltage and the second reference voltage.

More specifically, for example, the first DAC unit 30 includes a first switch 301, a second switch 303, and a first resistor 305. The first reference voltage is supplied to one end of the first resistor 305, and the other end of the resistor 305 is connected to one end of the first switch 301 and one end of the second switch 303. The other end of the first switch 301 is connected to the non-inverted input terminal of the fully differential amplifier 101. Furthermore, the other end of the second switch 303 is connected to the inverted input terminal of the fully differential amplifier 101. That is, the first switch 301 is included in wiring that supplies the first voltage to the non-inverted input terminal. Furthermore, the second switch 303 is included in wiring that supplies the first voltage to the inverted input terminal. Accordingly, the first switch 301 controls the supply of the first voltage to the non-inverted input terminal. In contrast, the second switch 303 controls the supply of the first voltage to the inverted input terminal.

It is preferred that the contact resistance between the other end of the first switch 301 and the non-inverted input terminal of the fully differential amplifier 101 be lower than the resistance value of the first resistor 305. Furthermore, it is preferred that the contact resistance between the other end of the second switch 303 and the inverted input terminal of the fully differential amplifier 101 be lower than the resistance value of the first resistor 305. The reason for this is that the ON resistances of the first switch 301 and the second switch 303 generally have nonlinearity, and therefore it is preferred that the contact resistance be lower than the resistance value of the first resistor 305 in order to reduce the influence of nonlinearity.

When the first switch 301 is in an ON state, the second switch 303 is in an OFF state. Furthermore, when the first switch 301 is in an OFF state, the second switch 303 is in an ON state. That is, the first switch 301 and the second switch 303 are complementary. For example, while the first switch 301 transitions between an ON state and an OFF state in response to the digital signal Ψ, the second switch 303 transitions between an ON state and an OFF state in response to the inverted signal of the digital signal Ψ.

When the second reference voltage is supplied to one end of the second resistor 505, the second DAC unit 50 alternately supplies voltage (second voltage) obtained at the other end of the second resistor 505 to the two input terminals of the fully differential amplifier 101. In other words, the second reference voltage is supplied to one end of the second resistor 505. Furthermore, the other end of the second resistor 505 is alternately connected to the two input terminals of the fully differential amplifier 101.

However, when the first DAC unit 30 supplies the first voltage to one input terminal of the fully differential amplifier 101, the second DAC unit 50 supplies the second voltage to the other input terminal of the fully differential amplifier 101. Furthermore, when the first DAC unit 30 supplies the first voltage to the other input terminal of the fully differential amplifier 101, the second DAC unit 50 supplies the second voltage to the one input terminal of the fully differential amplifier 101. That is, the first DAC unit 30 and the second DAC unit 50 are controlled so that they simultaneously supply the first voltage and the second voltage to the same input terminal of the fully differential amplifier 101. For example, when the digital signal Ψ is "H," the first DAC unit 30 supplies voltage obtained at the other end of the first resistor 305 to the one input terminal of the fully differential amplifier 101, but does not supply it to the other input terminal thereof. Furthermore, when the digital signal Ψ is "L," the first DAC unit 30 supplies voltage obtained at the other end of the first resistor 305 to the other input terminal of the fully differential amplifier 101, but does not supply it to the one input terminal thereof.

More specifically, for example, the second DAC unit 50 includes a third switch 501, a fourth switch 503, and a second resistor 505. The reference voltage −Vref is supplied to one end of the second resistor 505, and the other end of the second resistor 505 is connected to one end of the third switch 501 and one end of the fourth switch 503. The other end of the third switch 501 is connected to the inverted input terminal of the fully differential amplifier 101. Furthermore, the other end of the fourth switch 503 is connected to the non-inverted input terminal of the fully differential amplifier 101. That is, the third switch 501 is included in wiring that supplies the second voltage to the inverted input terminal. Furthermore, the fourth switch 503 is included in wiring that supplies the second voltage to the non-inverted input terminal. Accordingly, the third switch 501 controls the supply of the second voltage to the inverted input terminal. The fourth switch 503 controls the supply of the second voltage to the non-inverted input terminal.

It is preferred that the contact resistance between the other end of the third switch 501 and the inverted input terminal of the fully differential amplifier 101 be lower than the resistance value of the second resistor 505. Furthermore, it is preferred that the contact resistance between the other end of the fourth switch 503 and the non-inverted input terminal of the fully differential amplifier 101 be lower than the resistance value of the second resistor 505. The reason for this is that the ON resistances of the third switch 501 and the fourth switch 503 have nonlinearity, like that of the first switch 301 and the second switch 301 and 303, and therefore it is preferred that the contact resistance be lower than the resistance value of the second resistor 505 in order to reduce the influence of nonlinearity.

When the third switch 501 is in an ON state, the fourth switch 503 is in an OFF state. Furthermore, the third switch 501 is in an OFF state, the fourth switch 503 is in an ON state. That is, the third switch 501 and the fourth switch 503 are complementary.

Furthermore, when the first switch 301 is in an ON state, the third switch 501 is also in an ON state. Furthermore, when the first switch 301 is in an OFF state, the third switch 501 is also in an OFF state. That is, the first switch 301 and the third switch 501 are synchronous.

Likewise, the second switch 303 and the fourth switch 503 are synchronous. For example, when the third switch 501 transitions between an ON state and an OFF state in response to the digital signal Ψ, the fourth switch 503 transitions between an ON state and an OFF state in response to the inverted signal of the digital signal Ψ. Accordingly, when the third switch 501 is in an ON state, the fourth switch 503 is in an OFF state. Furthermore, when the third switch 501 is in an OFF state, the fourth switch 503 is in an ON state.

Furthermore, it is preferred that the resistance value of the first resistor 305 be equal to the resistance value of the second resistor 505.

In accordance with this configuration, the first reference voltage +Vref is supplied to one end of the first resistor 305, and therefore the voltage (first voltage) obtained at the other end thereof is alternately supplied to the non-inverted input terminal and the inverted input terminal of the fully differential amplifier 101. Furthermore, the second reference voltage −Vref is supplied to one end of the second resistor 505, and voltage (second voltage) obtained at the other end is alternately supplied to the non-inverted input terminal and inverted input terminal of the fully differential amplifier 101. In this case, when the first voltage is supplied to the non-inverted input terminal of the fully differential amplifier 101, the second voltage is supplied to the inverted input terminal of the fully differential amplifier 101. Furthermore, when the first voltage is supplied to the inverted input terminal of the fully differential amplifier 101, the second voltage is supplied to the non-inverted input terminal of the fully differential amplifier 101.

Since the non-inverted input terminal and inverted input terminal of the fully differential amplifier 101 are virtually grounded, the voltage of the non-inverted input terminal is approximately equal to the voltage of the inverted input terminal. Accordingly, even when the first voltage is alternately supplied to the non-inverted input terminal and inverted input terminal of the fully differential amplifier 101, the voltage at the other end of the first resistor 305 is approximately constant. Furthermore, the reference voltage +Vref is supplied to one end of the first resistor 305. Accordingly, even when the first DAC unit 30 switches the supply of the first voltage between the two input terminals of the fully differential amplifier 101 included in the integration circuit 10, the voltage at both ends of the first resistor 305 is kept approximately constant. Accordingly, even though the first resistor 305 has parasitic capacitance, the influence that the parasitic capacitance has on a power circuit can be made lower than that of the conventional technology. For this reason, even if the response speed, power consumption, or area of the power circuit that supplies the reference voltage +Vref is made smaller than that of the conventional technology, variation in the reference voltage +Vref can be prevented from increasing. Furthermore, since the number of transitions that the digital signal Ψ makes per hour can be increased, high-speed operation can be achieved.

Likewise, even when the second voltage is alternately supplied to the inverted input terminal and non-inverted input terminal of the fully differential amplifier 101, the voltage at the other end of the second resistor 505 is approximately constant. Furthermore, the second reference voltage −Vref is supplied to one end of the second resistor 505. Accordingly, even when the second DAC unit 50 switches the supply of the second voltage between two input terminals of the fully differential amplifier 101 included in the integration circuit 10, the voltage at both ends of the second resistor 505 is kept constant. Accordingly, even though the second resistor 505 has parasitic capacitance, the influence that the parasitic capacitance has on the power circuit can be made lower than that of the conventional technology. For this reason, even if the response speed, power consumption, or area of the power circuit that supplies the reference voltage −Vref is made smaller than that of the conventional technology, variation in the reference voltage −Vref can be prevented from increasing. Furthermore, since the number of transitions that the signal Ψ makes per hour can be increased, high-speed operation can be achieved.

Variant of First Embodiment

Figure 2:
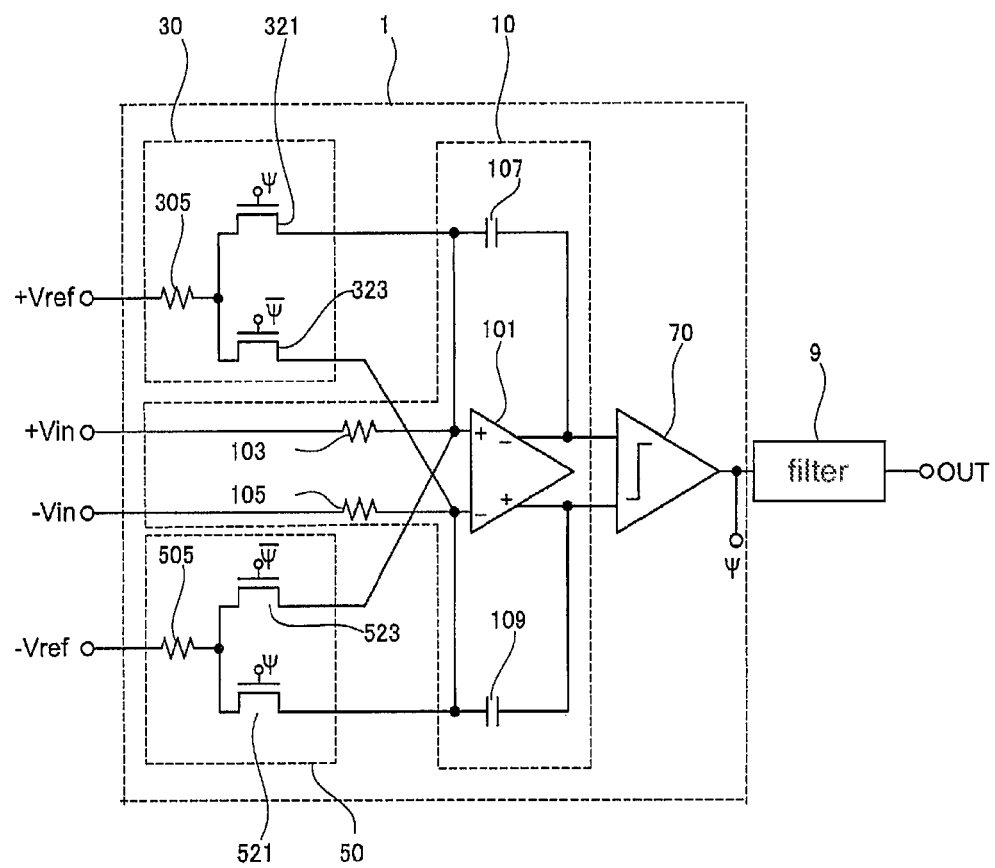
FIG. 2 is a circuit diagram of an A/D converter that is configured using the sigma-delta modulator of FIG. 1 according to a variant of the first embodiment.

FIG. 2 is a circuit diagram of an A/D converter that is configured using the sigma-delta modulator of FIG. 1 according to a variant of the first embodiment. In FIG. 2, the first switch 301, the second switch 303, the third switch 501, and the fourth switch 503 shown in FIG. 1 are implemented using a transistor 321, a transistor 323, a transistor 521, and a transistor 523, respectively.

It is preferable to use nMOSs as the transistor 321, the transistor 323, the transistor 521, and the transistor 523 (however, there are cases where pMOSs are preferable depending on the level of electric potential). Since the switches are formed of nMOSs, the ON resistances of the switches are reduced, so that the size of the switches can be made smaller. Furthermore, since the switches are smaller, the influence of the parasitic capacitance decreases, so that feedthrough or charge injection (a parameter related to an analog switch; when an analog switch is turned on/off, there is a case where a small amount of charge is coupled and injected from a digital control line to an analog signal path) that is a factor that causes an error in the output of the integration circuit can be reduced, thereby enabling high-speed operation. Furthermore, pMOSs may be used as the transistor 321, the transistor 323, the transistor 521, and the transistor 523.

In this variant, the voltages at the sources and drains of the transistor 321 and the transistor 323 are approximately the same when their ON resistances are considerably lower than the resistance values of the first resistor and the second resistor, and therefore the resistances are approximately the same when the transistor 321 and the transistor 323 are in an ON state. Accordingly, electrical resistance across the range from one end of the first resistor 305 to the non-inverted input terminal of the fully differential amplifier 101 in the case where the transistor 321 is in an ON state is made approximately the same as that across the range from one end of the first resistor 305 to the inverted input terminal of the fully differential amplifier 101 in the case where the transistor 323 is in an ON state.

Likewise, electrical resistance across the range from one end of the second resistor 505 to the inverted input terminal of the fully differential amplifier 101 in the case where the transistor 521 is in an ON state can be made approximately the same as that across the range from one end of the first resistor 305 to the non-inverted input terminal of the fully differential amplifier 101 in the case where the transistor 523 is in an ON state. As a result, the precision of the matching between the electrical resistance between the power circuit supplying the first reference voltage and the non-inverted input terminal, the electrical resistance between the power circuit supplying the first reference voltage and the inverted input terminal, the electrical resistance between the power circuit supplying the second reference voltage and the non-inverted input terminal, and the electrical resistance between the power circuit supplying the second reference voltage and the inverted input terminal can be improved.

Furthermore, when one of the transistor 321 and the transistor 523 that supply the reference voltage to the non-inverted input terminal of the fully differential amplifier is in an ON state, the other one is in an OFF state, so that the feedthrough or charge injection of the switch is cancelled out between the transistor 321 and the transistor 523, thereby being able to reduced the influence thereof. Likewise, when one of the transistor 323 and the transistor 521 that supply the reference voltage to the inverted input terminal of the fully differential amplifier is in an ON state, the other one is in an OFF state, so that the influence of the feedthrough or charge injection of the switch can be reduced, thereby contributing to high precision.

Furthermore, each of the transistor 321 and the transistor 523 may be configured using a CMOS switch in an nMOS and a pMOS are connected in parallel. In this case, control signals that are input to the gates of the nMOS and pMOS of each CMOS switch have complementary polarities. Furthermore, each of the transistor 323 and the transistor 521 may be also configured using a CMOS switch in which an nMOS and a pMOS are connected in parallel.

As described above, in accordance with this embodiment, the influence that charging and discharging attributable to the parasitic capacitance of the resistor to which the reference voltage is supplied exert on the power circuit can be made less than that of the conventional technology. Accordingly, even when the response speed, power consumption, or area of the power circuit is smaller than that of the conventional technology, variation in the reference voltage can be prevented from increasing, thereby providing the sigma-delta modulator capable of higher-speed operation.

Second Embodiment

Figure 3:
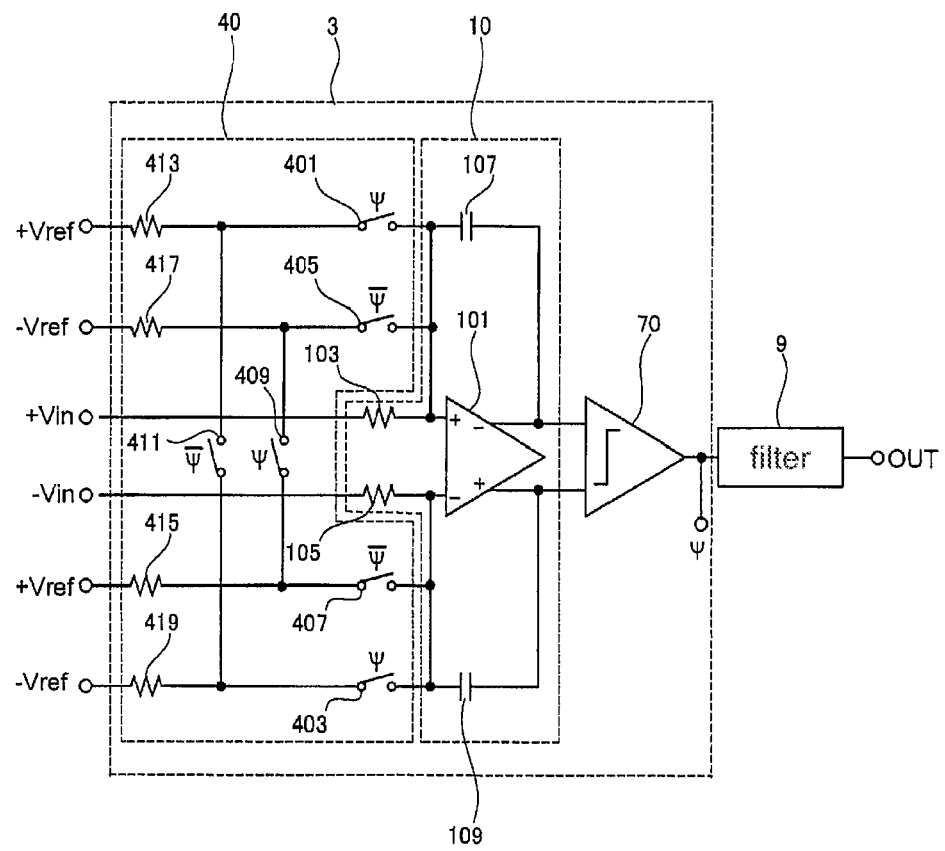
FIG. 3 is a circuit diagram of an A/D converter that is configured using a sigma-delta modulator according to a second embodiment of the present invention.

FIG. 3 is a circuit diagram of an A/D converter that is configured using a sigma-delta modulator according to a second embodiment of the present invention. The A/D converter shown in FIG. 3 includes a sigma-delta modulator 3 and a filter 9.

The sigma-delta modulator 3 integrates voltages obtained using reference voltages +Vref and −Vref and input voltages +Vin and −Vin, and then outputs digital signals. The sigma-delta modulator 3 includes an integration circuit 10 and a DAC unit 40. Furthermore, the DAC unit 40 includes a first DAC unit and a second DAC unit.

Here, first to fourth voltages are defined as follows. When the first reference voltage +Vref is supplied to one end of a first resistor 413, voltage obtained at the other end thereof is defined as the first voltage. When the second reference voltage −Vref is supplied to one end of a second resistor 417, voltage obtained at the other end thereof is defined as the second voltage. When the second reference voltage is supplied to one end of a third resistor 419, voltage obtained at the other end thereof is defined as the third voltage. When the first reference voltage is supplied to one end of a fourth resistor 415, voltage obtained at the other end thereof is defined as the fourth voltage.

In this case, the first DAC unit alternately supplies the first voltage and the second voltage to one input terminal of a fully differential amplifier 101 included in the integration circuit 10. Furthermore, the second DAC unit alternately supplies the third voltage and the fourth voltage to the other input terminal of the fully differential amplifier 101 included in the integration circuit 10. Furthermore, when the first DAC unit supplies the first voltage to one input terminal of the fully differential amplifier 101 included in the integration circuit 10, the second DAC unit supplies the third voltage to the other input terminal of the fully differential amplifier 101 included in the integration circuit 10. Furthermore, when the first DAC unit supplies the second voltage to one input terminal of the fully differential amplifier 101 included in the integration circuit 10, the second DAC unit supplies the fourth voltage to the other input terminal of the fully differential amplifier 101 included in the integration circuit 10.

The first switch 409 connects the other end of the second resistor 417 to the other end of the fourth resistor 415 when the first DAC unit supplies the first voltage to one input terminal of the fully differential amplifier 101, and does not connect the other end of the second resistor 417 to the other end of the fourth resistor 415 when the first DAC unit supplies the second voltage to one input terminal of the fully differential amplifier 101.

The second switch 411 does not connect the other end of the first resistor 413 to the other end of the third resistor 419 when the first DAC unit supplies the first voltage to one input terminal of the fully differential amplifier 101, and connects the other end of the first resistor 413 and the other end of the third resistor 419 when the first DAC unit supplies the second voltage to the input terminal of the fully differential amplifier 101.

The first DAC unit includes a third switch 401, a fourth switch 405, a first resistor 413, and a second resistor 417, as shown in FIG. 3. Furthermore, the second DAC unit includes a fifth switch 403, a sixth switch 407, a third resistor 419, and a fourth resistor 415, as shown in FIG. 3.

The first reference voltage +Vref is supplied to one end of the first resistor 413. The other end of the first resistor 413 is connected to one end of the third switch 401 and one end of the second switch 411. The second reference voltage −Vref is supplied to one end of the second resistor 417. The other end of the second resistor 417 is connected to one end of the fourth switch 405 and one end of the first switch 409. The second reference voltage is supplied to one end of the third resistor 419. The other end of the third resistor 419 is connected to one end of the fifth switch 403 and the other end of the second switch 411. The first reference voltage is supplied to one end of the fourth resistor 415. The other end of the fourth resistor 415 is connected to one end of the sixth switch 407 and the other end of the first switch 409.

That is, the third switch 401 is included in wiring that supplies the first voltage to the non-inverted input terminal. The fourth switch 405 is included in wiring that supplies the second voltage to the non-inverted input terminal. The fifth switch 403 is included in wiring that supplies the third voltage to the inverted input terminal. The sixth switch 407 is included in wiring that supplies the fourth voltage to the inverted input terminal. Accordingly, the third switch 401 controls the supply of the first voltage to the non-inverted input terminal.

Furthermore, the fourth switch 405 controls the supply of the second voltage to the non-inverted input terminal. Furthermore, the fifth switch 403 controls the supply of the third voltage to the inverted input terminal. The sixth switch 407 controls the supply of the fourth voltage to the inverted input terminal.

Furthermore, it is preferred that the contact resistance between the other end of the third switch 401 and the non-inverted input terminal be lower than the resistance value of the first resistor 413. It is preferred that the contact resistance between the other end of the fourth switch 405 and the non-inverted input terminal be less than the resistance value of the second resistor 417. It is preferred that the contact resistance between the other end of the fifth switch 403 and the inverted input terminal be lower than the resistance value of the third resistor 419. It is preferred that the contact resistance between the other end of the sixth switch 407 and the inverted input terminal be lower than the resistance value of the fourth resistor 415. Since the ON resistances of the third switch 401, the fourth switch 405, the fifth switch 403 and the sixth switch 407 generally have nonlinearity, it is preferred that the ON resistances of the switches be low in order to reduce the influence of the nonlinearity.

In this case, when the third switch 401 is in an ON state, the fourth switch 405 is in an OFF state, the fifth switch 403 is in an ON state, the sixth switch 407 is in an OFF state, the first switch 409 is in an ON state, and the second switch 411 is in an OFF state. Furthermore, when the third switch 401 is in an OFF state, the fourth switch 405 is in an ON state, the fifth switch 403 is in an OFF state, the sixth switch 407 is in an ON state, the first switch 409 is in an OFF state, and the second switch 411 is in an ON state.

Furthermore, it is preferred that the resistance value of the first resistor 413 be the same as that of the third resistor 419. Furthermore, it is preferred that the resistance value of the second resistor 417 be the same as the fourth resistor 415. Furthermore, it is preferred that all the resistance values of the first resistor 413, the third resistor 419, the second resistor 417, and the fourth resistor 415 be the same.

For example, when the third switch 401 transitions between an ON state and an OFF state in response to the digital signal $\Psi$, the fourth switch 405 transitions between an ON state and an OFF state in response to the inverted signal of the digital signal $\Psi$.

Furthermore, when the fifth switch 403 transitions between an ON state and an OFF state in response to the digital signal $\Psi$, the sixth switch 407 transitions between an ON state and an OFF state in response to the inverted signal of the digital signal $\Psi$. Accordingly, the third switch 401 and the fifth switch 403 are synchronous, and the fourth switch 405 and the sixth switch 407 are synchronous. However, the third switch 401 and the fourth switch 405 are complementary. Furthermore, the fifth switch 403 and the sixth switch 407 are also complementary. Since all of the switches operate in synchronization with each other as described above, the first reference voltage and the second reference voltage are fed back to the integration circuit 10.

As shown in FIG. 3, one end of the first switch 409 is connected to the other end of the second resistor 417, and the other end thereof is connected to the other end of the fourth resistor 415. Furthermore, one end of the second switch 411 is connected to the other end of the first resistor 413, and the other end thereof is connected to one end of the third resistor 419. The first switch 409 transitions between an ON state and an OFF state in response to the signal $\Psi$, and the second switch 411 transitions between an ON state and an OFF state in response to the inverted signal of the signal $\Psi$. Accordingly, the first switch 409 and the second switch 411 are complementary. Furthermore, the state of the first switch 409 can be made the same as those of the third switch 401 and the fifth switch 403. Likewise, the state of the second switch 411 can be made the same as those of the fourth switch 405 and the sixth switch 407.

In this embodiment, when the third switch 401 and the fifth switch 403 are in an ON state, the fourth switch 405 and the sixth switch 407 are in an OFF state. Furthermore, the first switch 409 is in an ON state. The second switch 411 is in an OFF state. Accordingly, in this case, the other end of the second resistor 417 is connected to the other end of the fourth resistor 415, and therefore the voltage at the other ends thereof is the intermediate voltage between +Vref and −Vref. Furthermore, since a non-inverted input and an inverted input to the fully differential amplifier 101 are made to have the approximately same voltage by a virtual ground, the voltage at the other end of the first resistor 413 and the voltage at the other end of the third resistor 419 are equal to the intermediate voltage between +Vref and −Vref.

Meanwhile, since the logic of the digital signal $\Psi$ is changed and therefore the third switch 401 and the fifth switch 403 are in an OFF state, the fourth switch 405 and the sixth switch 407 are in an ON state. Furthermore, the first switch 409 is in an OFF state. The second switch 411 is in an ON state. Accordingly, the voltage at the other end of the first resistor 413 and the voltage at the other end of the third resistor 419 are the intermediate voltage between +Vref and −Vref. Furthermore, the voltage at the other end of the second resistor 417 and the voltage at the other end of the fourth resistor 415 are also made to be the intermediate voltage between +Vref and −Vref by a virtual ground.

Accordingly, in this embodiment, even when first to sixth switches transition between an ON state and an OFF state because of a change in the logic of the digital signal Ψ, voltages at the other ends of the first to fourth resistors are approximately the same as the electric potential before the transition, and therefore are maintained at the intermediate voltage between +Vref and −Vref. That is, variation in the voltages at the other ends of the first to fourth resistors can be made low. For this reason, the amount of charge that is generated by parasitic capacitance and moves through the first to fourth resistors and the power circuit can be made less than that of the conventional technology. Accordingly, even though the first to fourth resistors have parasitic capacitance, the influence that the parasitic capacitance has on the power circuit can be made lower than that of the conventional technology. Accordingly, even when the capacity of the power circuit is made less than that of the conventional technology, variation in the reference voltage can be prevented from increasing, thereby providing a sigma-delta modulator that is capable of high-speed operation.

Furthermore, the first to sixth switches may be configured using transistors, as described in conjunction with the first embodiment. Furthermore, nMOSs or pMOSs may be used as the transistors. Furthermore, it is preferred that each of the ON resistances of the first switch 409 and the second switch 411 be twice each of those of the third switch 401, the fifth switch 403, the fourth switch 405, and the sixth switch 407. Furthermore, it is preferred that the first switch 409 and the second switch 411 be formed by arranging two switches each of which is identical to each of the third switch 401, the fifth switch 403, the fourth switch 405, and the sixth switch 407 and which are connected in series. The reason for this is that voltages at both ends of the resistors can be made equivalent in accordance with the characteristics of the switches, and also the influence of charge injection or feedthrough can be made lower by cancelling it out.

Third Embodiment

Figure 4:
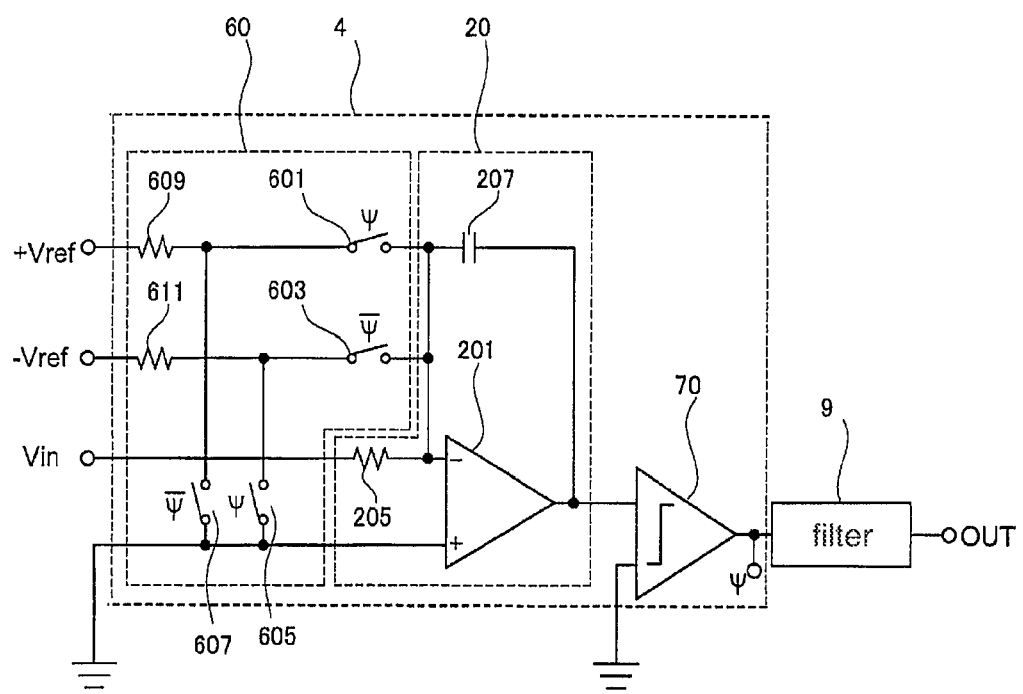
FIG. 4 is a circuit diagram of an A/D converter that is configured using a sigma-delta modulator according to a third embodiment of the present invention.
Figure 5:
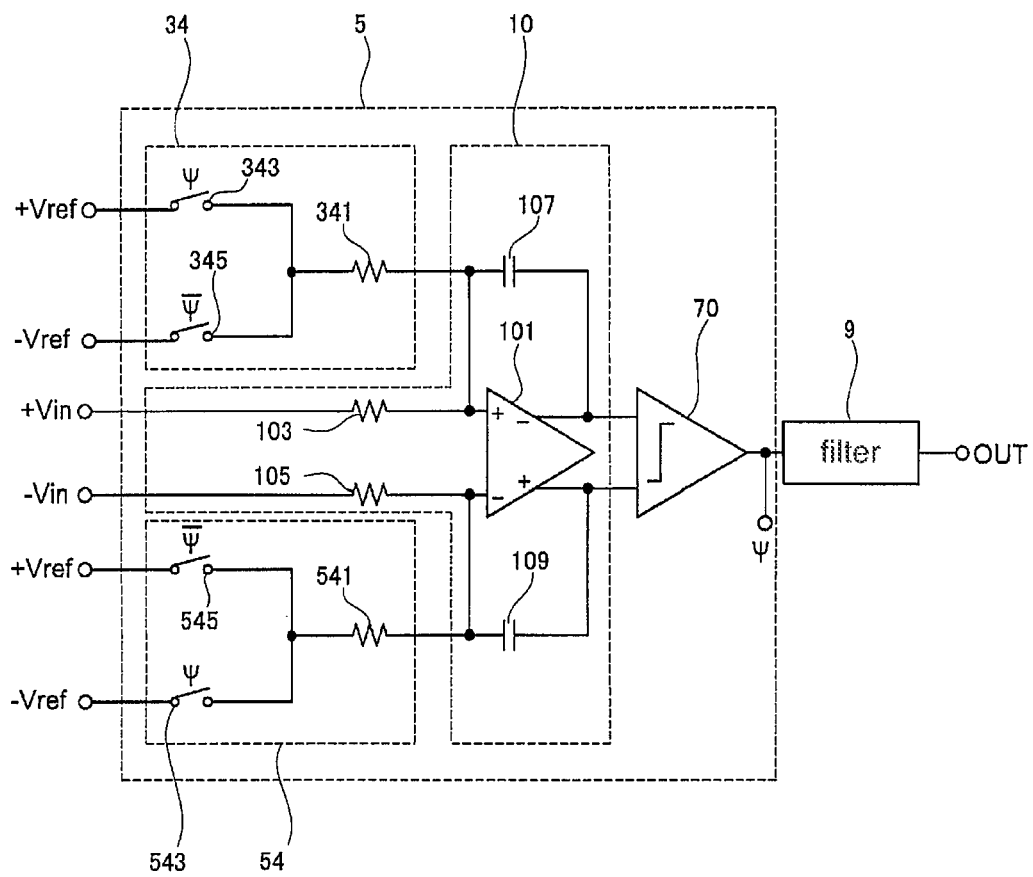
FIG. 5 is a circuit diagram of an A/D converter using a conventional sigma-delta modulator.
Figure 6:
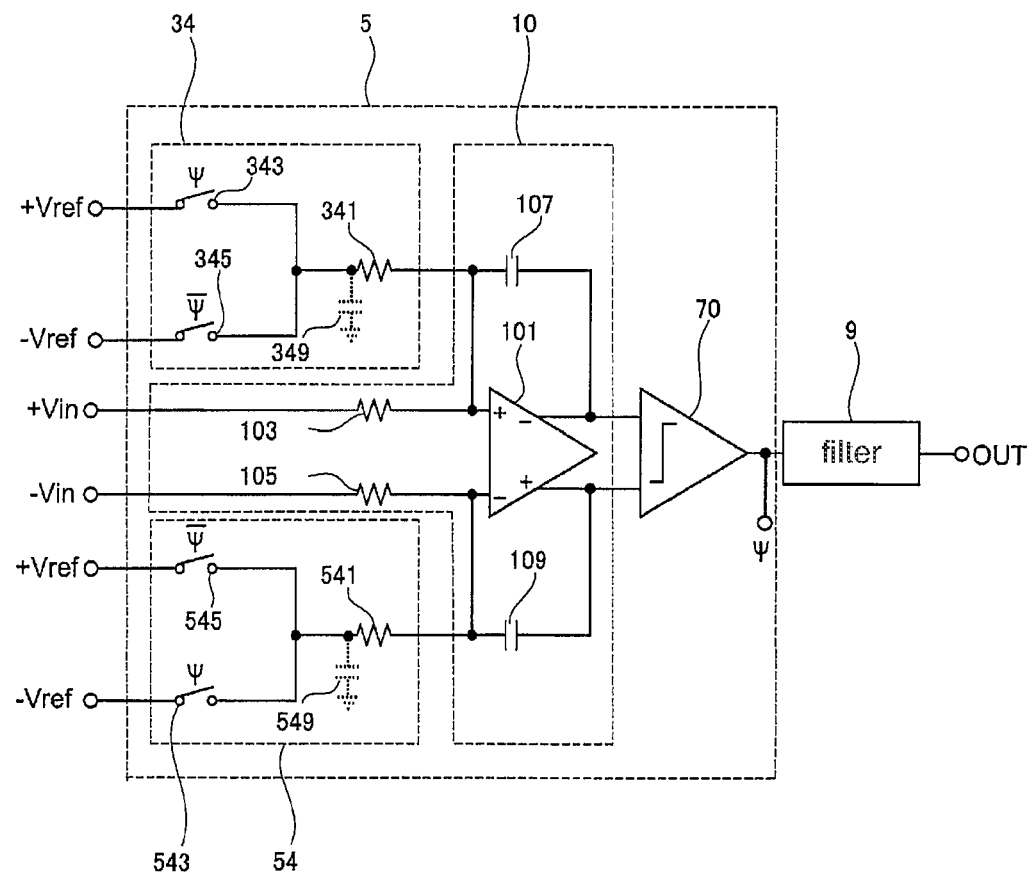
FIG. 6 is a circuit diagram of an A/D converter using a conventional sigma-delta modulator.

FIG. 4 is a circuit diagram of an A/D converter that is configured using a sigma-delta modulator according to a third embodiment of the present invention. The A/D converter whose circuit diagram is shown in FIG. 4 includes a sigma-delta modulator 4 and a filter 9. Here, the number of integral values output by the sigma-delta modulator 4 is 1, and a comparator 70 compares the integral value with a predetermined voltage.

The sigma-delta modulator 4 integrates a voltage obtained from the input voltage +Vin while using reference voltages +Vref and −Vref, and outputs a digital signal Ψ. The sigma-delta modulator 4 includes an integration circuit 20 and a DAC unit 60.

The integration circuit 20 includes a differential amplifier 201 and a capacitor 207. The differential amplifier 201 includes a non-inverted input terminal and an inverted input terminal as input terminals. The capacitor 207 is connected to the differential amplifier 201 so that a signal output from the differential amplifier 201 can be fed back to the inverted input terminal.

An input voltage Vin is supplied to one end of an input resistor 205, and the other end is connected to the inverted input terminal of the differential amplifier 201.

The DAC unit 60 includes a first DAC unit and a second DAC unit. When the first reference voltage +Vref is supplied to one end of the first resistor 609, the first DAC unit alternately supplies a voltage (first voltage) obtained at the other end thereof to two input terminals of the differential amplifier 201 that is included in the integration circuit 20. Furthermore, when the second reference voltage −Vref is supplied to one end of the second resistor 611, the second DAC unit alternately supplies a voltage (second voltage) obtained at the other end thereof to two input terminals of the differential amplifier 201 that is included in the integration circuit 20. Meanwhile, the first DAC unit and the second DAC unit are controlled such that the first voltage and the second voltage are supplied to different input terminals of the integration circuit 20.

A specific configuration of the first DAC unit is a configuration including a first switch 601, a second switch 607, and a first resistor 609. Furthermore, a specific configuration of the second DAC unit is a configuration including a third switch 603, a fourth switch 605, and a second resistor 611.

The reference voltage +Vref is supplied to one end of the first resistor 609. The other end of the first resistor 609 is connected to one end of the first switch 601 and one end of the second switch 607. The reference voltage −Vref is supplied to one end of the second resistor 611. The other end of the second resistor 611 is connected to one end of the third switch 603 and one end of the fourth switch 605. Furthermore, it is preferred that the resistance value of the first resistor 609 be the same as that of the second resistor 611.

The other end of the first switch 601 is connected to the inverted input terminal of the differential amplifier 201. The other end of the second switch 607 is connected to the non-inverted input terminal of the differential amplifier 201. The other end of the third switch 603 is connected to the inverted input terminal of the differential amplifier 201. The other end of the fourth switch 605 is connected to the non-inverted input terminal of the differential amplifier 201. It is preferred that the value of the contact resistance between the other end of the first switch 601 and the inverted input terminal of the differential amplifier 201 and the contact resistance between the other end of the second switch 607 and the non-inverted input terminal of the differential amplifier 201 is less than that of the first resistor 609. It is preferred that the resistance value of the contact resistance between the other end of the third switch 603 and the inverted input terminal of the differential amplifier 201 and contact resistance between the other end of the fourth switch 605 and the non-inverted input terminal of the differential amplifier 201 is less than that of the second resistor 611. The reason for this is that since the ON resistances of the first switch 601, the second switch 607, the third switch 603, and the fourth switch 605 generally have nonlinearity, it is preferred that the ON resistances of the switches be low in order to reduce the influence of nonlinearity.

As a result, the first switch 601 is included in wiring that supplies the first voltage to the inverted input terminal. Accordingly, the first switch 601 controls the supply of the first voltage to the inverted input terminal. Furthermore, the third switch 603 is included in wiring that supplies the second voltage to the inverted input terminal. Accordingly, the third switch 603 controls the supply of the second voltage to the inverted input terminal.

When the first switch 601 transitions between an ON state and an OFF state in response to, for example, a digital signal Ψ, the second switch 607 transitions between an ON state and an OFF state in response to the inverted signal of the digital signal Ψ. Accordingly, the first switch 601 and the second switch 607 are complementary.

Furthermore, when the third switch 603 transitions between an ON state and an OFF state in response to the inverted signal of the digital signal Ψ, the fourth switch 605 transitions between an ON state and an OFF state in response to the digital signal Ψ. Accordingly, the third switch 603 and the fourth switch 605 are complementary. Furthermore, the third switch 603 and the first switch 601 are complementary. Also, the fourth switch 605 and the second switch 607 are complementary.

In this embodiment, when the first switch 601 and the fourth switch 605 are in an ON state, the third switch 603 and the second switch 607 are in an OFF state. Accordingly, the voltage at the other end of the second resistor 611 is made the same as that at the non-inverted input terminal of the differential amplifier 201. Voltage at the other end of the second resistor 611 is made approximately the same as that at the inverted input terminal of the differential amplifier 201 by a virtual ground. As a result, the voltage at the other end of the second resistor 611 is made approximately the same as that at the other end of the first resistor 609.

Meanwhile, when the logic of the digital signal Ψ is changed and therefore the first switch 601 and the fourth switch 605 are in an OFF state, the second switch 607 and the third switch 603 are in an ON state. Accordingly, in this case, the voltage at the other end of the second resistor 611 is made approximately the same as the voltage at the inverted input terminal of the differential amplifier 201, and is made approximately the same as that at the non-inverted input terminal of the differential amplifier 201 by a virtual ground. As a result, the voltage at the other end of the second resistor 611 is made approximately the same as that at the other end of the first resistor 609.

Accordingly, in this embodiment, the voltage at the other end of the first resistor 609 is kept approximately the same as that at the other end of the second resistor 611, like in the second embodiment. Accordingly, the amount of charge that moves among the first resistor 609, the second resistor 611 and the power circuit because of the parasitic component of the resistors can be reduced. Accordingly, even though the first resistor 609 and the second resistor 611 have parasitic capacitance, the influence that the parasitic capacitance has on the power circuit can be made lower than that of the conventional technology. For this reason, even when the response speed, power consumption, or area of the power circuit that supplies the reference voltages +Vref and −Vref is made smaller than that of the conventional technology, variation in the reference voltage +Vref can be prevented from increasing. Furthermore, since the number of transitions that the digital signal Ψ makes per hour can be increased, high-speed operation can be enabled.

The sigma-delta modulator according to the present invention enables the power circuit to be made smaller in size than the conventional sigma-delta modulator, thereby reducing power consumption. Furthermore, the sigma-delta modulator according to the present invention is more suitable for high-speed operation than the conventional sigma-delta modulator.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sigma-delta modulator, comprising:
an integration circuit configured to include a first terminal and a second terminal, and to integrate a voltage supplied via the first terminal;
a first DAC unit configured to, when a first reference voltage is supplied to one end of a first resistor, alternately supply a first voltage obtained at a remaining end of the first resistor to the first terminal and the second terminal; and
a second DAC unit configured to, when a second reference voltage is supplied to one end of a second resistor, alternately supply a second voltage obtained at a remaining end of the second resistor to the second terminal or the first terminal;
wherein the second DAC unit supplies the second voltage to the second terminal when the first DAC unit supplies the first voltage to the first terminal, and the second DAC unit supplies the second voltage to the first terminal when the first DAC unit supplies the first voltage to the second terminal.

2. The sigma-delta modulator of claim 1, wherein:
the first DAC unit includes:
a first switch included in wiring that supplies the first voltage to the first terminal; and
a second switch included in wiring that supplies the first voltage to the second terminal;
the second DAC unit includes:
a third switch included in wiring that supplies the second voltage to the second terminal; and
a fourth switch included in wiring that supplies the second voltage to the first terminal;
wherein when the first switch is in an ON state, the second switch is in an OFF state, the third switch is in an ON state, and the fourth switch is in an OFF state; and
wherein when the first switch is in an OFF state, the second switch is in an ON state, the third switch is in an OFF state, and the fourth switch is in an ON state.

3. The sigma-delta modulator of claim 2, wherein:
the first switch and the third switch are each formed of a transistor configured such that a synchronous first signal is supplied to a gate electrode thereof; and
the second switch and the fourth switch are each formed of a transistor configured such that a second signal that is an inverted signal of the first signal is supplied to a gate electrode thereof.

4. The sigma-delta modulator of claim 3, wherein the transistors are nMOS transistors.

5. The sigma-delta modulator of claim 1, wherein the integration circuit includes:
a differential amplifier configured to include an output terminal and a non-inverted input terminal and an inverted input terminal as input terminals thereof; and
a capacitor configured to feed back a signal of the output terminal to the non-inverted input terminal;
wherein the first terminal is the non-inverted input terminal, and the second terminal is the inverted input terminal.

6. A sigma-delta modulation circuit, comprising:
an integration circuit configured to include a first terminal and a second terminal, and to integrate voltages respectively supplied via the first terminal and the second terminal;
a first DAC unit configured to alternately supply a first voltage, obtained at one end of a first resistor when a first reference voltage is supplied to a remaining end of the first resistor, and a second voltage, obtained at a remaining end of a second resistor when a second reference voltage is supplied to a remaining end of the second resistor, to the first terminal;
a second DAC unit configured to alternately supply a third voltage, obtained at one end of a third resistor when the second reference voltage is supplied to a remaining end of the third resistor, and a fourth voltage, obtained at a remaining end of a fourth resistor when the first reference voltage is supplied to a remaining end of the fourth resistor, to the second terminal;

a first switch configured to connect the one end of the second resistor to the one end of the fourth resistor, and to selectively enter an ON state and an OFF state; and a second switch configured to connect the one end of the first resistor to the one end of the third resistor, and to selectively enter an ON state and an OFF state;

wherein when the first DAC unit supplies the first voltage to the first terminal, the second DAC unit supplies the third voltage to the second terminal, the first switch enters an ON state, and the second switch enters an OFF state; and wherein when the first DAC unit supplies the second voltage to the first terminal, the second DAC unit supplies the fourth voltage to the second terminal, the first switch enters an OFF state, and the second switch enters an ON state.

* * * * *